United States Patent [19]

Fiorito et al.

[11] Patent Number: 4,629,975
[45] Date of Patent: Dec. 16, 1986

[54] COAXIAL PROBE FOR MEASURING THE CURRENT DENSITY PROFILE OF INTENSE ELECTRON BEAMS

[75] Inventors: Ralph Fiorito, Bethesda; Michael Raleigh, Laurel, both of Md.

[73] Assignee: The United States of America as represented by the Secretary of the Navy, Washington, D.C.

[21] Appl. No.: 640,178

[22] Filed: Jun. 19, 1984

[51] Int. Cl.$^4$ .......................... G01N 27/00; G01K 1/08
[52] U.S. Cl. ...................................... 324/71.3; 250/397
[58] Field of Search ........................ 328/233; 250/397; 324/71.3, 72.5, 464

[56] References Cited

U.S. PATENT DOCUMENTS 3,239,664  3/1966  Farrell ................................. 324/71.3
3,293,429  12/1966  Leboutet ............................. 324/71.3

FOREIGN PATENT DOCUMENTS 0818315  11/1982  U.S.S.R. .............................. 324/71.3

Primary Examiner—Gerard R. Strecker
Assistant Examiner—Jose M. Solis
Attorney, Agent, or Firm—Kenneth E. Walden; John G. Wynn

[57] ABSTRACT

An interceptive type electric probe for mapping the radial current density profile of high energy and high current electron beams comprises an input sensor, an interface support connector and an output support connector. The entire structure of the electric probe is configured to closely approximate a coaxial transmission line of a predetermined impedance that is opened ended but yet shielded. The nature of the construction of the probe, in terms of materials and techniques, allows for survival thereof in high temperature and intense beam environments.

11 Claims, 3 Drawing Figures

COAXIAL PROBE FOR MEASURING THE CURRENT DENSITY PROFILE OF INTENSE ELECTRON BEAMS

BACKGROUND OF THE INVENTION

1. Field of Invention

The present invention relates to an apparatus for measuring the current density profile of intense electron beams, but more specifically it relates to an interceptive type electric probe for mapping the radial current density profile of high energy and high current electron beams.

2. Description of the Prior Art

The use of interceptive type probes for measuring the current density profile of electron beams is a common technique in accelerators producing low current, i.e., less than one ampere. Severe requirements are imposed on interceptive devices when current densities of the order of kiloamperes per square centimeter are encountered. In this case, space charge effects, large secondary electron production and probe heating are important considerations.

At the present time, measurement of the beam current density profile of an intense electron beam involves the monitoring of x-rays produced by probes fabricated from high atomic number wires inserted into the electron beam. This measurement system suffers the disadvantages of requiring extensive shielding and elaborate measurement equipment including an x-ray collimator, photomultiplier tube, a fast scintillator and a power supply powering the photomultiplier tube. Accordingly, this type of measurement system is necessarily bulky and expensive.

In practice, when a high energy electron beam hits a high atomic number wire probe, radiation is produced in the x-ray region of the electromagnetic spectrum. The amount of x-radiation produced depends on how much of the electron beam is intercepted by the probe. This measuring technique is very viable for mapping the radial current density profile of an intense electron beam; however, the technique suffers from a number of problems in addition to the previously mentioned ones. One problem is that the materials used to fabricate the probes heat excessively. Thus, from an engineering standpoint, probes made out of these materials have short lives and melt after a short period of time when used in the environment of the intense electron beams. Also, the monitoring system used has to be very sensitive, and, hence, will be sensitive to background x-radiation. This is the reason for the substantial amount of shielding. The shielding is made from lead and has to be configured to surround the monitoring system which makes it bulky, non-portable, very heavy, and, accordingly, very expensive.

Consequently, there is a need in the prior art to configure a probe for measuring the current density of an intense electron beam that is long lived, compact, easy to deploy, portable, and yet inexpensive and requires minimum support equipment for proper operation.

Another technique attempted in the prior art for measuring the beam current of intense electron beams was to make an electrical measurement rather than a measurement of x-rays. As far as it is known, no investigator has obtained an electrical signal, from which useful current density data could be elicited, from an intense electron beam using a bare wire type of interceptive probe. In actual practice, if a bare wire type probe is connected to a coaxial line and interfaced with an oscilloscope, and then inserted into an intense electron beam, a signal is produced which can be observed on the oscilloscope. This signal is very difficult to analyze. One reason is that when the probe is placed into an associated accelerator tube in which the intense electron beam is generated, and the electron beam is not intercepted, a zero response is desirable. On the other hand, when the probe is placed so as to intercept the electron beam an increase in response is desirable. However, with a bare wire the moment that the probe is placed inside the accelerator tube, a response is observed which indicates that there is field coupling between the bare wire probe and the the electron beam within the accelerator tube. The nature of the coupling has been found to be capacitive and, as aforementioned, is field produced.

There is yet another kind of problem that the bare wire electric probe encounters. When an intense electron beam travels through an accelerator tube, it produces a substantial amount of noise of the radio frequency (RF) type. The bare wire electric probe is susceptible to this RF noise which makes the extraction of any useful data from the probe signals about the electron beam very difficult. Thus, the bare wire probe suffers from the undesirable effects of being affected by both electric and magnetic fields which are external to the actual beam charge.

Consequently, there is a need in the prior art to eliminate the effects of field coupling, both electric and magnetic, between a probe for measuring the current density profile of intense electron beams and the electron beam being measured. There is an additional necessity to eliminate the effect of RF type noise which affects the accuracy of the measurements.

There is yet another problem with the bare metal wire probe. When the wire probe is used in the environment of an accelerator tube which pulses on and off very rapidly, there is a tendency for it to melt after continual use. Thus, this probe and the x-ray monitor system which also uses a metal wire probe, are limited in their useful lives.

Consequently, there is a need in the prior art to configure a probe for measuring the beam current density profile of intense electron beams, but yet be configured to have a long life time.

The representative prior art, as outlined hereinabove, include some advances in the measurement of the current density profiles of intense electron beams; however, insofar as can be determined, no prior art device incorporates all of the features and advantages of the present invention.

OBJECTS OF THE INVENTION

Accordingly, an important object of the present invention is to configure an interceptive electric probe to measure the beam current density profile of a pulsed intense electron beam in an improved manner.

Another object of the present invention is to configure the electric probe to be sensitive only to electron beam charges within the volume thereof.

Still another object of the present invention is to configure the electric probe to approximate an open ended but shielded coaxial transmission line.

A further object of the present invention is to configure the electric probe to survive the high temperatures encountered when measuring the intense electron beams.

Yet a further object of the present invention is to configure the electric probe to be essentially self-contained, easily built and deployed, and relatively inexpensive.

SUMMARY OF THE INVENTION

In accordance with the above stated objects, other objects, features and advantages, the present invention has as a primary purpose the mapping of the radial current density profile of high energy and high current electron beams with an electric probe that is essentially self-contained, easily built and deployed, and relatively inexpensive.

The essence of the present invention is in configuring the electric probe to closely approximate a "capped-off" coaxial transmission line, i.e., an open ended but shielded line, having a predetermined impedance.

The purpose of the present invention is carried out by coaxially constructing the electric probe to comprise an input sensor, and interface support connector and an output support connector. The input sensor comprises an inner sensor tip and an outer sensor tip shield. The inner sensor tip is formed of graphite, and the outer sensor tip shield, which acts as an electrostatic shield, is also formed of graphite.

The input sensor is press fitted into the interface support connector so as to maintain the coaxial transmission line configuration. The interface support connector is press fitted into the output support connector so as to also maintain the coaxial configuration. The output support connector also includes a coaxial connector for connecting the electric probe to a display such as an oscilloscope. The interface suppport connector includes, inter alia, an inner interface conductor, which is operatively connected to the inner sensor tip of the input sensor. An inner support vacuum seal plug portion of the output support conductor is configured to secure the inner interface conductor and to form a vacuum seal therebetween. An interface support conductor vacuum orifice, configured in the interface support connector, allows the space surrounding the inner interface conductor to be evacuated by an associated vacuum system.

BRIEF DESCRIPTION OF THE DRAWINGS

The previously stated objects, other objects, features and advantages of the present invention will be apparent from the more particular description of the preferred embodiment as illustrated in the accompanied drawings, in which.

DESCRIPTION OF THE PREFERRED EMBODIMENT

Figure 1:
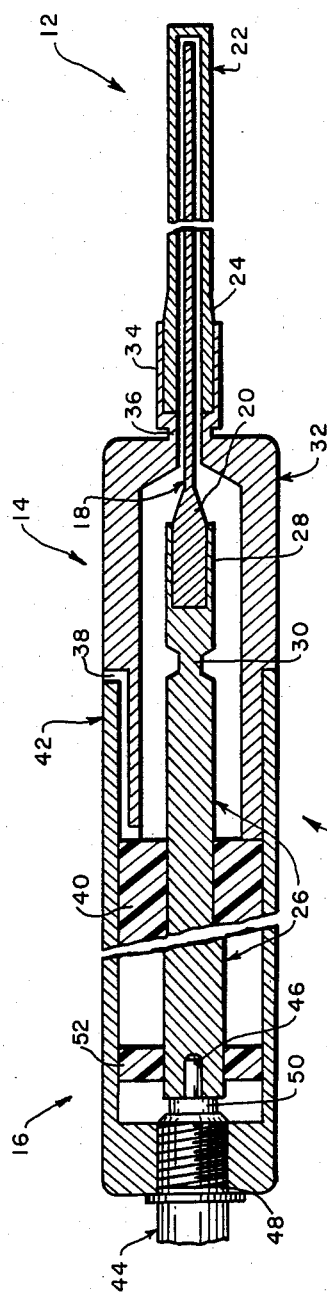
FIG. 1 is a partially fragmented and partially cutaway view of the electric probe, according to the present invention.

FIG. 1 shows an embodiment of a coaxial beam current density probe 10 in which the present invention is employed. The coaxial beam current density probe 10 comprises an input sensor 12, an interface support connector 14 and an output support connector 16. The input sensor 12 comprises an inner sensor tip 18, which is configured to be cylindrical with a predetermined diameter uniformly formed from one end, along its length, to an integral but larger inner sensor tip shoulder 20 at its other end. The input sensor 12 further comprises an outer sensor tip shield 22, which is also configured cylindrical, but, with predetermined inner and outer diameters uniformly formed from one end, along its length, to an integral but larger outer sensor tip shield shoulder 24 at its other end. The outer sensor tip shield 22 is disposed coaxially about the inner sensor tip 18. This configuration forms a uniform gap between the inner sensor tip 18 and the outer sensor tip shield 22 along their lengths a predetermined distance.

Still referring to FIG. 1, the interface support connector 14 comprises an inner interface conductor 26 having an integrally formed inner interface conductor shoulder support sleeve 28 at one of its ends. The inner interface conductor 26 is also configured cylindrically and has a predetermined diameter substantially uniformly formed, along its length, from the one end to the other end thereof. As shown, the inner sensor tip 18 is press fitted into the inner interface conductor shoulder support sleeve 28 of the inner interface conductor 26 so as to form an electrical connection and a mechanical support. An interference fit joint is formed when the connection is made.

The interface support connector 14 further comprises an outer interface conductor 32 having an outer interface conductor shoulder support sleeve 34 integrally formed at one end thereof. The outer interface conductor 32 is configured cylindrically with predetermined inner and outer diameters substantially uniformly formed, along its length, from the one end to the other end thereof. The outer sensor tip shield 22 is supported mechanically and electrically connected to the outer interface conductor 32 via an interference fit joint formed between the outer sensor tip shield shoulder 24 and the outer interference conductor shoulder support sleeve 34. As depicted, the outer interface conductor 32 is coaxially disposed about the inner interface conductor 26 so as to form a uniform gap larger than the previously mentioned gap between the inner sensor tip 18 and the outer sensor tip shield 22 of the input sensor 12, aforementioned.

The inner interface conductor 26 further includes an inner interface conductor neck 30 fashioned therein adjacent to the aforementioned interference fit joint formed between the inner sensor tip shoulder 20 of the inner sensor tip 18 and the inner interface conductor shoulder support sleeve 28 of the inner interface conductor 26. The interference fit joint formed can be bent, at the inner interface conductor neck 30, to adjust the alignment of the inner sensor tip 18 in respect to the inner interface conductor 26.

Likewise, the outer interface conductor 32 of the interface support connector 14 further includes an outer interface conductor neck 36 fashioned therein adjacent to the interference fit joint formed between the outer sensor tip shield shoulder 24 of the outer sensor tip shield 22 and the outer interface conductor shoulder support sleeve 34 of the outer interface conductor 32. Accordingly, the interference fit joint formed can be bent, at the outer interface conductor neck 36, to adjust the alignment of the outer sensor tip shield 22 in respect to the inner sensor tip 18 of the input sensor 12, aforementioned.

Still referring to FIG. 1, the output support connector 16 comprises an inner support/vacuum seal plug 40 and an outer support conductor 42. The inner support/vacuum seal plug 40 is configured so that it supports the inner interface conductor 26 of the inner interface support connector 14 at the one end thereof. When the inner interface conductor 26 is pressed through the inner support/vacuum seal plug 40, a vacuum seal is formed at the interface therebetween. The outer support conductor 42 is configured to be cylindrical and has predetermined inner and outer diameters substantially uniformly formed, along its length, from one end to the other end thereof. The one end of the outer support conductor 42 is configured so that the outer interface conductor 32 of the interface support connector 14 can be pressed therein. In so doing, a mechanical support and also an electrical connection is formed therebetween. The one end of the outer support conductor 42 is also configured so that the inner support/vacuum seal plug 40, when pressed therein, forms a vacuum seal therebetween, and, accordingly, an inner conductor space corresponding to the uniform gap and the larger uniform gap, aforementioned.

As shown in FIG. 1 an interface support conductor vacuum orifice 38 is formed when the one end of the outer support conductor 42 of the output support connector 16 is pressed over the other end of the outer interface conductor 32 of the interface support connector 14. The interface support conductor vacuum orifice 38 connects to the aforementioned inner conductor space allowing it to be evacuated so as to prevent the electric probe 10 from being shorted by an internal plasma.

The output support connector 16 further includes a coaxial connector 44 having an inner conductor 46, an outer conductor 48 and a support/insulating plug 50. The output support connector 16 also includes an inner support plug 52 configured and disposed so that the inner interface conductor 26 of the interface support connector 14 is supported. The inner support plug 52 also maintains an even larger uniform gap between the inner interface conductor 26 and the outer support conductor 42. As shown, the inner interface conductor 26 is slightly larger in diameter at its other end so as to maintain the predetermined impedance of the coaxial electric probe 10. The coaxial connector 44 is threadedly connected to the other end of the outer support conductor 42 forming an electrical connection therebetween. Also, the inner conductor 46 is pressed fitted into a sleeve fashioned in the other end of the inner interface conductor 26 forming, therebetween, a good electrical connection.

STATEMENT OF THE OPERATION

Figure 3:
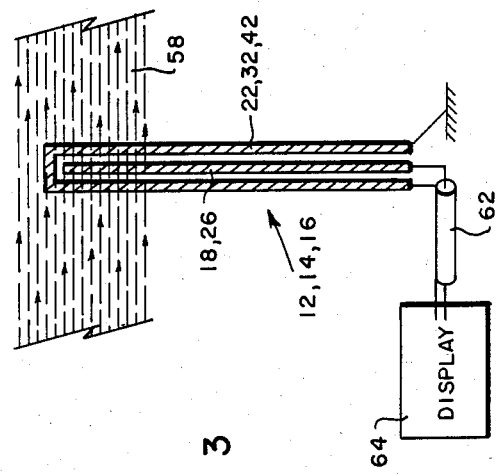
FIG. 3 is a schematic representation of the electric probe of FIG. 1 showing inter alia, its open ended but shielded coaxial transmission line configuration, according to the present invention.
Figure 2:
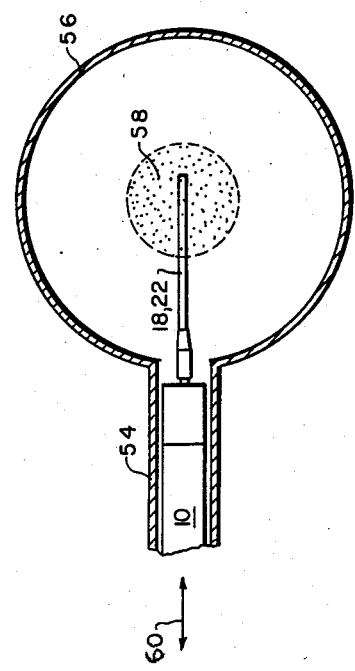
FIG. 2 is a partially fragmented and partially cutaway sketch depicting how the electric probe of FIG. 1 is inserted radially into a high energy electron beam generated in an associated accelerator tube.

Details of the operation, according to the coaxial beam current density probe 10 of FIG. 1, previously described, are explained in conjunction with FIGS. 1, 2 and 3 as viewed concurrently.

In operation, the coaxial beam current density probe 10 is inserted radially into a port 54 of an associated accelerator tube 56, and, accordingly, into a high energy and high current electron beam 58. The electron beam 58 passes through the inner sensor tip 18 and the outer sensor tip shield 22 of the input sensor 12 and secondary electrons, "knocked on" from the input sensor 12 result in a signal proportional to the intercepted current. A small electrostatic coupling to the electron beam charge present within the volume of the inner sensor tip 18, and between the inner sensor tip 18 and the outer sensor tip shield 22, i.e., the gap formed therebetween, gives an additional signal proportional to the time derivative of the intercepted current. The coaxial beam current density probe 10 possesses the spatial resolution to allow mapping of the radial current density profile of the electron beam 58. This is accomplished by mechanically scanning the coaxial beam density probe 10 through the electron beam 58 as a function of its radius, as depicted by the directional arrow 60. The signal generated in the coaxial beam current density probe 10 is transmitted via a coaxial cable 62 to a display 64 for observation and recording.

The input sensor 12, configured with the inner sensor tip 18 and the outer sensor tip shield 22, forms an open ended but shielded coaxial transmission line having a predetermined impedance. For purposes of the present invention, the predetermined impedance is 50 ohms. Also, for purposes of the present invention, the input sensor 12, including the inner sensor tip and the outer sensor tip shield 22, is made of standard grade graphite, AXFQ-50, from Poco Graphite, Inc. The inner interface conductor 26 and the outer interface conductor 32 of the interface support connector 14 are both made of non-magnetic stainless steel. Likewise, the outer support conductor 42 of the output support connector 16 is also made of non-magnetic stainless steel. The inner support/vacuum seal plug 40 is made of "Teflon" (a registered trademark for DuPont fluorocarbon resins). The inner support plug 52 can be fabricated of any good insulating material. The coaxial connector 44, for purposes of the present invention, is an off-the-shelf chassis mount coaxial connector.

For purposes of the present invention, the length of the input sensor 12 from the one end to the shoulder 24 should at least be as long as the diameter of the electron beam 58 for an accurate mapping. For purposes of the present invention, this length is 6 cm. The diameter of the outer sensor tip shield 22 should be small in comparison to the diameter of the electron beam 58. In the present insistance, the outer diameter of the outer sensor tip shield 22 is 4.3 mm. Also, the thickness of the outer sensor tip shield 22 and the inner sensor tip 18 should be small enough to allow the electron beam 58 to pass therethrough. In the present insistance, the inner diameter of the outer sensor tip shield 22 is 2.3 mm, and the diameter of the inner sensor tip 18 is 1 mm.

The foregoing dimensions will allow electron beams having energies of 4 Mev to be properly scanned. Additionally, in the present insistance, the coaxial electric probe 10 will satisfactorily operate with currents of 1 A.

To those skilled in the art, many modifications and variations of the present invention are possible in light of the above teachings, it is therefore to be understood that the present invention can be practiced otherwise than as specifically described herein and still be within the spirit and scope of the appended claims.

What is claimed is:

1. A coaxial electric probe for mapping the radial current density profile of a high energy and high current electron beam generated in an associated accelerator tube, said coaxial electric probe comprising:
   an input sensor configured so as to eliminate capacitive coupling between the electron beam and said input sensor and reduce the effects of radio frequency (RF) fields, due to noise generated by the electron beam, when said input sensor is inserted and then scanned radially therein, the input sensor comprising:

an inner sensor tip configured to be cylindrical with a predetermined diameter uniformly formed from one end thereof, along its length, to an integral but larger inner sensor tip shoulder at its other end;

an outer sensor tip shield configured to be cylindrical with predetermined inner and outer diameters uniformly formed from one end thereof, along its length, to an integral but larger outer sensor tip shield shoulder at its other end, said outer sensor tip shield being coaxially disposed about said inner sensor tip so as to form a uniform gap therearound along their lengths a predetermined distance so as to form substantially an open ended but shielded coaxial transmission line of a predetermined impedance;

an interface support connector configured so as to support said input sensor and form an electrical connection therebetween, the inner interface conductor having an integrally formed inner interface conductor shoulder support sleeve at one end thereof, said inner interface conductor being configured to be cylindrical with a predetermiend diameter substantially uniformly formed, along its length, from the one end to the other end thereof, said inner sensor tip of said input sensor being mechanically supported and electrically connected to said inner interface conductor via an interference fit joint formed between said inner sensor tip shoulder of said inner sensor tip and said inner interface conductor shoulder support sleeve of said inner interface conductor; and an output support connector configured so as to support said interface support connector and form an electrical connection between, the outer interface conductor having an integrally formed outer interface conductor shoulder support sleeve at one end thereof, said outer interface conductor being configured to be cylindrical with predetermined inner and outer diameters substantially uniformly formed, along its length, from the one end to the other end thereof, said outer sensor tip shield of said input sensor being mechanically supported and electrically connected to said outer interface conductor via an interference fit joint formed between said outer sensor tip shield shoulder of said outer sensor tip shield and said outer interface conductor shoulder support sleeve, said outer interface conductor being coaxially disposed about said inner interface conductor thereby forming a larger uniform gap therearound.

2. The coaxial electric probe of claim 1 wherein said inner interface conductor of said interface support connector further comprises an inner interface conductor neck fashioned therein adjacent to the interference fit joint formed between said inner sensor tip shoulder of said inner sensor tip and said inner interface conductor shoulder support sleeve of said inner interface conductor, such that the interference fit joint can be bent at said inner interface conductor neck to adjust the alignment of said inner sensor tip in respect to said inner interface conductor.

3. The coaxial electric probe of claim 3 wherein said outer interface conductor of said interface support connector further comprises an outer interface conductor neck fashioned therein adjacent to the interference fit joint formed between said outer sensor tip shield shoulder of said outer sensor tip shield and said outer interference conductor, such that the interference fit joint can be bent at said outer interface conductor neck to adjust the alignment of said outer sensor tip shield in respect to said inner sensor tip.

4. The coaxial electric probe of claim 3 wherein said output support connector comprises:

an inner support/vacuum seal plug configured so that said inner interface conductor of said interface support connector is supported thereby at the one end thereof, and, when pressed therethrough, a seal sufficient to hold a vacuum at the interface therebetween is formed; and an outer support conductor configured to be cylindrical with predetermined inner and outer diameters substantially uniformly formed, along its length, from one end to the other end thereof, the one end of said outer support conductor being configured such that said outer interface conductor of said interface support connector can be pressed therein thereby furnishing mechanical support and forming an electrical connection therebetween, and being configured such that said inner support/vacuum seal plug when pressed therein forms a vacuum seal therebetween and an interconductor space corresponding to the uniform gap and the larger uniform gap.

5. The coaxial electric probe of claim 4 wherein the one end of said outer support conductor of said output support connector is configured so that when pressed over the other end of said outer interface conductor of said interface support connector, a vacuum orifice is formed therein and connected to the interconductor space, the vacuum orifice allowing the interconductor space to be evacuated so as to prevent said coaxial electric probe from being shorted by an internal plasma.

6. The coaxial electric probe of claim 5 wherein said output support connector further comprises:

an inner support plug configured so that said inner interface conductor of said interface support connector is supported thereby at the other end thereof and so as to form an even larger uniform gap therearound; and a coaxial connector having an inner conductor, an outer conductor and a support/insulating plug therebetween, said inner and outer conductors of said coaxial connector being electrically connected to said inner interface conductor of said interface support connector, and being electrically connected to said outer support conductor of said output support connector, respectively, said interface support connector and said output support connector coacting with said input sensor so as to maintain the open ended and shielded configuration of said coaxial electric probe along with its predetermined impedance.

7. The coaxial electric probe of claim 6 wherein said inner sensor tip and said outer sensor tip shield of said input sensor are both made of graphite.

8. The coaxial electric probe of claim 7 wherein said inner interface conductor and said outer interface conductor of said interface support connector are both made of non-magnetic stainless steel.

9. The coaxial electric probe of claim 8 wherein said inner support/vacuum seal plug is made of "Teflon".

10. The coaxial electric probe of claim 9 wherein said outer support conductor of said output support connector is made of non-magnetic stainless steel.

11. The coaxial electric probe of claim 10 wherein the predetermined impedance is 50 ohms.

* * * * *